(12) United States Patent
Shi et al.

(10) Patent No.: US 12,543,490 B2
(45) Date of Patent: Feb. 3, 2026

(54) DISPLAY SUBSTRATE, DISPLAY MODULE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Jiafan Shi, Beijing (CN); Liqiang Chen, Beijing (CN); Chuandong Liao, Beijing (CN); Wanxu Gao, Beijing (CN); Xin Zhang, Beijing (CN); Yangjie Wan, Beijing (CN); Shengxing Zhang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 432 days.

(21) Appl. No.: 18/028,357

(22) PCT Filed: Jun. 30, 2022

(86) PCT No.: PCT/CN2022/102779
§ 371 (c)(1),
(2) Date: Mar. 24, 2023

(87) PCT Pub. No.: WO2024/000386
PCT Pub. Date: Jan. 4, 2024

(65) Prior Publication Data
US 2024/0315122 A1    Sep. 19, 2024

(51) Int. Cl.
*H10K 77/10* (2023.01)
*H10K 59/80* (2023.01)
*H10K 102/00* (2023.01)

(52) U.S. Cl.
CPC ......... *H10K 77/111* (2023.02); *H10K 59/873* (2023.02); *H10K 2102/311* (2023.02)

(58) Field of Classification Search
CPC ............... H10K 77/111; H10K 59/873; H10K 2102/311; H10K 59/131; G09F 9/33
See application file for complete search history.

(56) References Cited

U.S. PATENT DOCUMENTS

2020/0050055 A1    2/2020  Higano et al.
2024/0130209 A1*   4/2024  You ........................ H10K 59/88

FOREIGN PATENT DOCUMENTS

| CN | 111509022 A | 8/2020 |
|---|---|---|
| CN | 112198981 A | 1/2021 |

(Continued)

*Primary Examiner* — J. E. Schoenholtz
(74) *Attorney, Agent, or Firm* — Nath, Goldberg & Meyer; Joshua B. Goldberg

(57) ABSTRACT

Provided is a display substrate, including a display area and a bonding area located at a side edge of the display area and connected therewith; the bonding area includes a first non-bendable region, a bendable region and a second non-bendable region sequentially arranged and connected; the display substrate further includes a base, and an inorganic insulating layer, a metal conductive layer and an organic insulating layer successively located on the base; orthographic projections of the inorganic and organic insulating layers on the base are located in the display area and the first and second non-bendable regions; the metal conductive layer extends from the display area to the first non-bendable region, the bendable region and the second non-bendable region; the display substrate further includes an adjustment protective layer made of Optical Clear Resin and located on the organic insulating layer; and the adjustment protective layer covers the bendable region.

20 Claims, 6 Drawing Sheets

(56) References Cited

FOREIGN PATENT DOCUMENTS

| CN | 112573834 A | 3/2021 |
| CN | 113053990 A | 6/2021 |
| CN | 114141137 A | 3/2022 |
| CN | 114170901 A | 3/2022 |

* cited by examiner (--Prior Art--)

(--Prior Art--)

(--Prior Art--)

DISPLAY SUBSTRATE, DISPLAY MODULE AND DISPLAY DEVICE

This is a National Phase Application filed under 35 U.S.C. 371 as a national stage of PCT/CN2022/102779, filed Jun. 30, 2022, the content of which is hereby incorporated by reference in its entirety.

TECHNICAL FIELD

The present disclosure relates to the field of display technology, and particularly relates to a display substrate, a display module and a display device.

BACKGROUND

Organic Light-Emitting Diode (OLED) display devices have gained widespread attention because of their characteristics of self-luminescence, high brightness, wide viewing angle, high contrast, flexibility, and low power consumption, and have begun to gradually replace conventional liquid crystal display (LCD) devices as a new generation of display devices, and are widely applied to mobile phone screens, computer monitors, full-color televisions, and the like.

SUMMARY

In a first aspect, an embodiment of the present disclosure provides a display substrate, including a display area and a bonding area, the bonding area being located at a side edge of the display area and being connected with the display area, where
 the bonding area includes a first non-bendable region, a bendable region and a second non-bendable region, which are sequentially arranged in a direction away from the display area and are sequentially connected;
 the display substrate further includes a base, an inorganic insulating layer, a metal conductive layer and an organic insulating layer;
 the inorganic insulating layer, the metal conductive layer and the organic insulating layer are located on the base and successively arranged in a direction away from the base;
 orthographic projections of the inorganic insulating layer and the organic insulating layer on the base are located in the display area, the first non-bendable region and the second non-bendable region;
 the metal conductive layer extends from the display area to the first non-bendable region, the bendable region and the second non-bendable region.

In some implementations, the display substrate further comprises an adjustment protective layer located on a side of the organic insulating layer away from the base;
 an orthographic projection of the adjustment protective layer on the base covers the bendable region, and a material of the adjustment protective layer comprises Optical Clear Resin.

In some implementations, the inorganic insulating layer includes a first inclined part at a boundary between the first non-bendable region and the bendable region;
 an included angle larger than 0° and less than or equal to 90° is formed between the first inclined part and the base;
 the inorganic insulating layer includes a second inclined part at a boundary between the second non-bendable region and the bendable region;
 an included angle larger than 0° and less than or equal to 90° is formed between the second inclined part and the base; and
 the orthographic projection of the adjustment protective layer on the base covers orthographic projections of the first inclined part and the second inclined part on the base.

In some implementations, the adjustment protective layer further extends to cover at least a portion of the first non-bendable region and at least a portion of the second non-bendable region; and
 in the first non-bendable region and the second non-bendable region, the orthographic projection of the adjustment protective layer on the base does not overlap with an orthographic projection of the organic insulating layer on the base.

In some implementations, an overall thickness of the adjustment protective layer is uniform; or
 a thickness of a portion of the adjustment protective layer corresponding to the bendable region is larger than a thickness of another portion of the adjustment protective layer corresponding to another region other than the bendable region.

In some implementations, the organic insulating layer includes a first sub-layer and a second sub-layer sequentially arranged in a direction away from the base;
 an orthographic projection of the first sub-layer on the base is located in the bendable region;
 the metal conductive layer includes a plurality of sub-patterns;
 multiple sub-patterns are arranged in the bendable region;
 in the bendable region, an orthographic projection of the first sub-layer on the base surrounds at a periphery of an orthographic projection of the sub-pattern on the base, and the first sub-layer is in contact with an edge end surface of the sub-pattern.

In some implementations, in the bendable region, orthographic projections of first sub-layers on the base are complementary to orthographic projections of the sub-patterns on the base; and
 the adjustment protective layer is in contact with surfaces of the first sub-layers and the sub-patterns away from the base.

In some implementations, in the bendable region, the orthographic projections, surrounding at the periphery of orthographic projections of any two adjacent sub-patterns on the base, of the first sub-layers on the base are spaced apart from each other;
 the adjustment protective layer is in contact with surfaces of the first sub-layers and the sub-patterns away from the base, and a portion of the adjustment protective layer is in contact with the base.

In some implementations, the first sub-layer has a thickness in a range from 0.5 μm to 1 μm in a direction away from the edge end surface of the sub-pattern.

In some implementations, a thickness of the adjustment protective layer is in a range from 0.2 μm to 20 μm.

In some implementations, the base is made of a flexible material.

In a second aspect, an embodiment of the present disclosure provides a display module, including the display substrate described above.

In some implementations, the display module has a display side and a back side opposite to each other,
 the bendable region of the display substrate is bent towards the back side;

the first non-bendable region of the display substrate is located at the display side; and the second non-bendable region of the display substrate is located at the back side.

In a third aspect, an embodiment of the present disclosure provides a display device including the display module described above.

BRIEF DESCRIPTION OF DRAWINGS

The accompanying drawings are included to provide a further understanding of embodiments of the present disclosure, and are incorporated in and constitute a part of this specification, illustrate embodiments of the present disclosure and together with the description serve to explain the principles of the present disclosure but are not to limit the present disclosure. The above and other features and advantages will become more apparent to those skilled in the art by describing in detail exemplary embodiments with reference to the attached drawings.

DETAIL DESCRIPTION OF EMBODIMENTS

Figure 1:
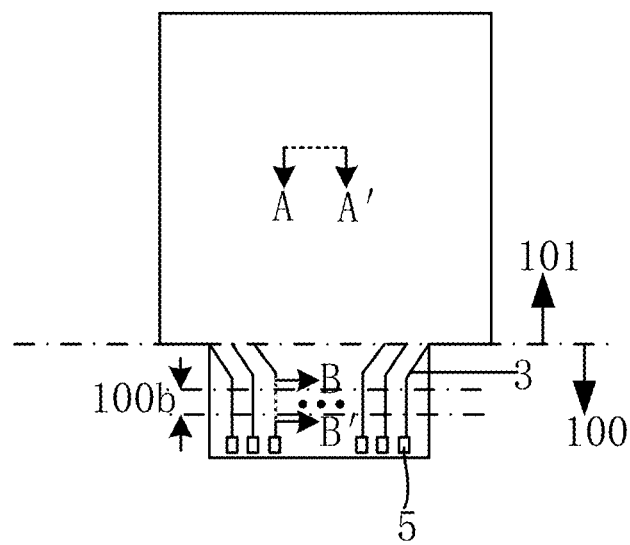
FIG. 1 is a schematic top view of a structure of an OLED display panel in the related art.

In order to make those skilled in the art better understand the technical solutions of the embodiments of the present disclosure, a display substrate, a display module and a display device provided by the embodiments of the present disclosure will be further described in detail below in combination with the accompanying drawings and specific implementations.

The embodiments of the present disclosure will be described more fully hereinafter with reference to the accompanying drawings, but the embodiments shown may be embodied in different forms and should not be construed as limited to the embodiments set forth herein. Rather, these embodiments are provided so that the present disclosure will be thorough and complete, and will fully convey the scope of the present disclosure to those skilled in the art.

The embodiments of the present disclosure are not limited to the embodiments shown in the drawings, but include modifications of configurations formed based on a manufacturing process. Thus, regions illustrated in the drawings have schematic properties, and shapes of the regions shown in the drawings illustrate specific shapes of the regions, but are not intended to be limiting.

At present, with the rapid development of the OLED (Organic Light-Emitting Diode) display industry, a large number of new display devices are gradually entering the market. In order to obtain a larger screen ratio and provide a good visual experience for customers, narrowed bezel has become a trend of display devices.

FIG. 1 shows a schematic top view of a structure of an OLED display panel in the related art, as shown in FIG. 1, the OLED display panel includes a display area 101 and a bonding area 100, where circuit wires (such as data lines, gate lines, power lines, light-emitting control lines, reset control lines, and the like) in the display area 101 extend to the bonding area 100, and are bound and connected with a device mainboard (such as a main control circuit board) through bonding connection terminals 5 disposed in the bonding area 100, so that the device mainboard provides driving or control signals for the display panel. The bonding area 100 is generally located at a lower border of the display panel, and in order to implement a narrow bezel of the display panel, a portion of the bonding area 100 is generally bent to a back side of the display panel and fixed. Reduction of a bending radius of the bonding area 100 has a great benefit in reducing a width of a lower bezel of the display panel. Meanwhile, as the bending radius of the bonding area 100 is reduced, a bending yield of the bonding area 100 is significantly reduced, and improvement of the bending yield of the bonding area 100 is beneficial to improvement of the product competitiveness.

Figure 2:
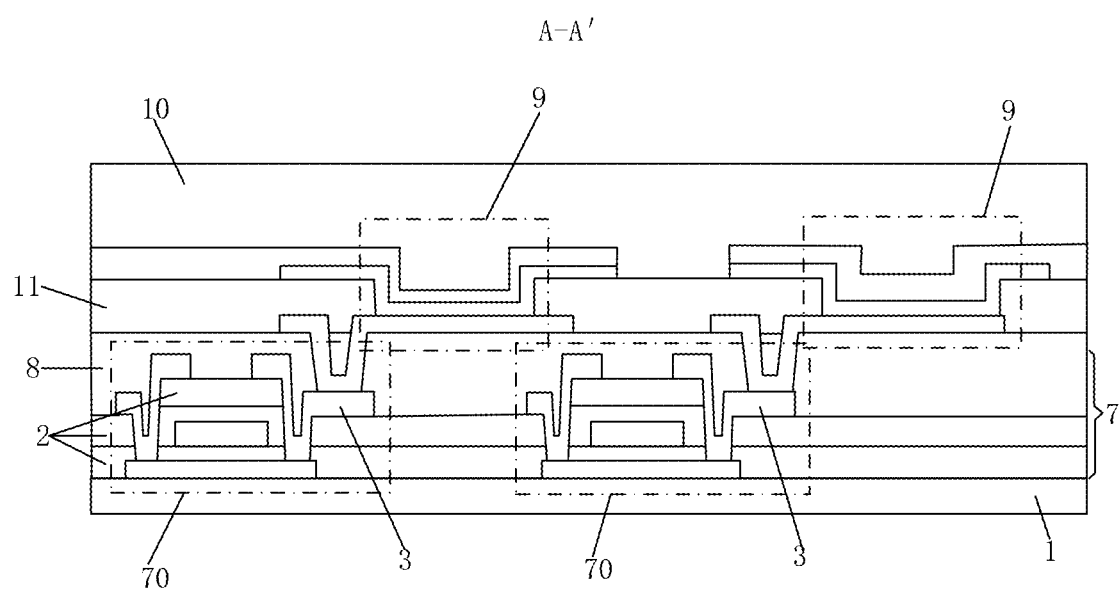
FIG. 2 is a cross-sectional view of the structure in FIG. 1 taken along a cutting line AA'.
Figure 3:
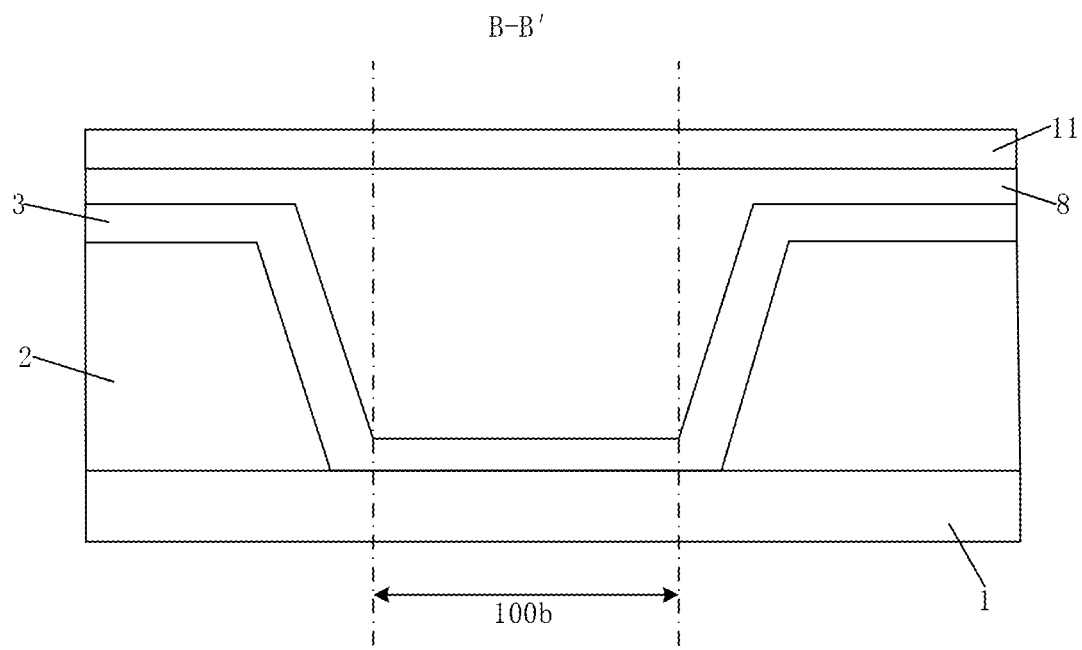
FIG. 3 is a cross-sectional view of the structure in FIG. 1 taken along a cutting line BB'.

FIG. 2 is a cross-sectional view of the structure in FIG. 1 taken along a cutting line AA', and FIG. 3 is a cross-sectional view of the structure in FIG. 1 taken along a cutting line BB', referring to FIGS. 2 to 3, the OLED display panel includes a base 1, and a pixel driving circuit layer 7, an organic planarization layer 8, a light-emitting element 9 and an encapsulation layer 10, which are sequentially arranged on the base 1, where the pixel driving circuit layer 7 and the light-emitting element 9 are located in the display area 101, and the encapsulation layer 10 is configured to encapsulate the light-emitting element 9. The pixel driving circuit layer 7 includes a transistor 70 and an inorganic insulating layer 2 disposed between conductive film layers of the transistor 70, where some circuit wires (such as data lines, gate lines, power lines, light-emitting control lines, reset control lines, and the like) connected to the pixel driving circuit layer 7 are respectively transferred to a metal conductive layer 3, where a source and a drain of the transistor 70 are located, from different conductive film layers, and theses circuit wires extend from the display area 101 to the bonding area 100 and are respectively connected to the bonding connection terminals 5 located in the bonding area 100, so as to be connected with the device mainboard. Referring to FIG. 2, the OLED display panel further includes a pixel defining layer 11 disposed on the organic planarization layer 8, where the pixel defining layer 11 defines a region where the light emitting element 9 is located. Referring to FIGS. 1 and 3, the bonding area 100 includes a bendable region 100b, by bending the bendable region 100b towards the back side of the display panel, a portion of the bonding area 100 is bent to the back side of the display panel and fixed. Film layer structures in the bendable region 100b, from bottom to top, include the base 1, the metal conductive layer 3 including various circuit wires extending from the display area 101 to the bonding area 100, the organic planarization layer 8 and the pixel defining layer 11 extending from the display area 101 to the bonding area 100. The organic planarization layer 8 and the pixel defining layer 11 are generally made of an organic resin material.

Referring to FIG. 3, in the bendable region 100b, the organic planarization layer 8 and the pixel defining layer 11 are formed on the metal conductive layer 3, since elongations at break of the organic planarization layer 8 and the pixel defining layer 11 during bending the organic planarization layer 8 and the pixel defining layer 11 are low, i.e., the organic planarization layer 8 and the pixel defining layer 11 have poor bending endurance, for example, the elongation at break of a film layer made of an organic resin material is 3.89%, and the elongation at break of a metal material is higher, e.g., 10%, during bending the bendable region 100b, the organic material layer on the metal conductive layer 3 is prone to become a starting point of fracture in the film layers, which causes fracture of the metal conductive layer 3 therebelow, and causes breakage of the circuit wires in the bendable region 100b, thereby resulting in bending fault of the bendable region 100b and seriously affecting the quality of the OLED display panel.

Figure 4:
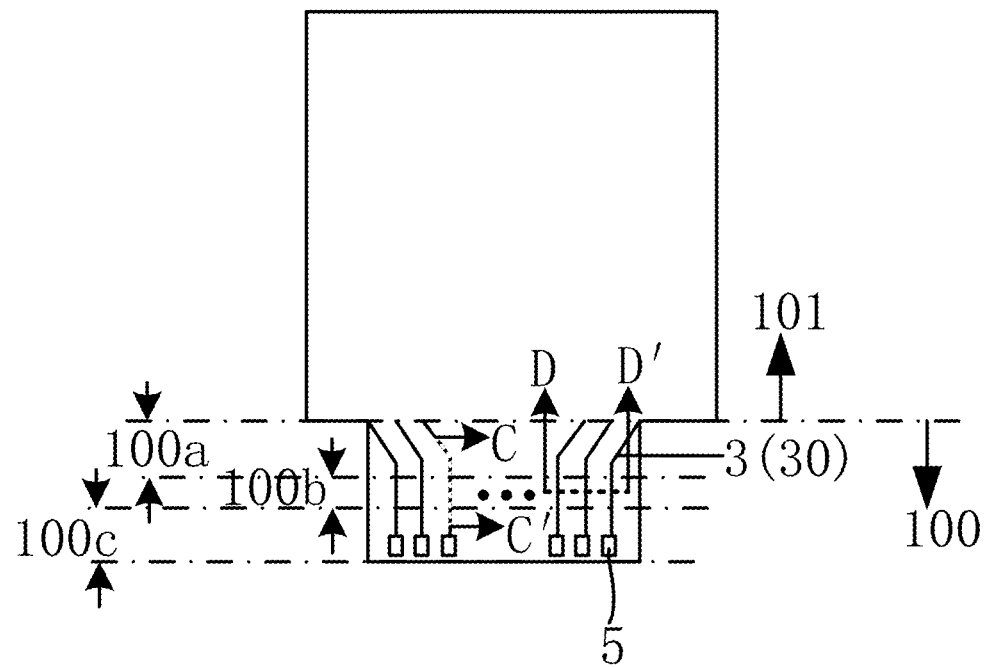
FIG. 4 is a schematic top view of a structure of a display substrate according to an embodiment of the present disclosure.
Figure 5:
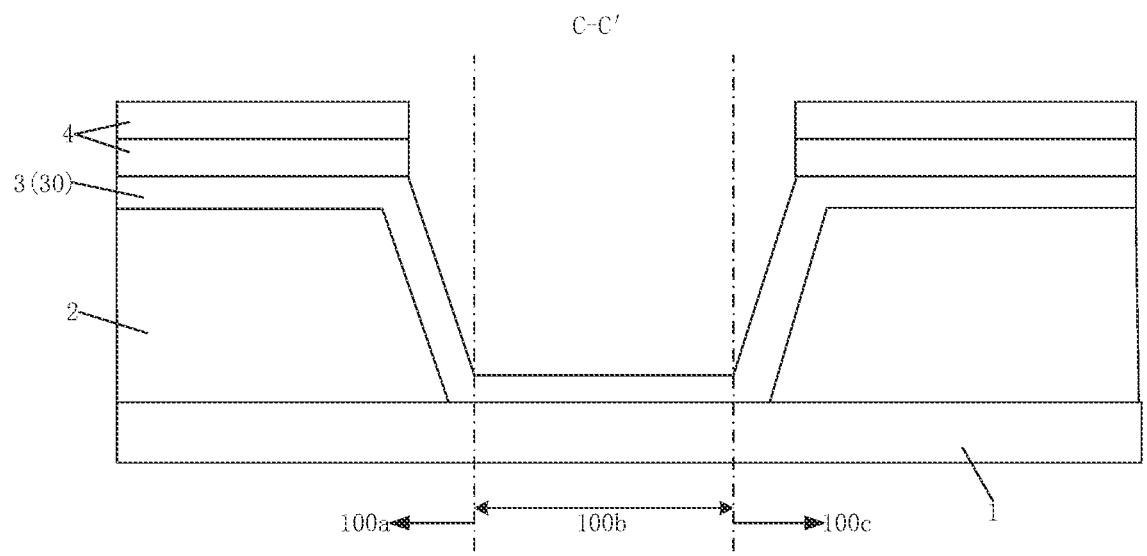
FIG. 5 is a cross-sectional view of the structure in FIG. 4 taken along a cutting line CC'.

In view of the above problems in the related art, in a first aspect, an embodiment of the present disclosure provides a display substrate. FIG. 4 is a schematic top view of a structure of a display substrate in an embodiment of the present disclosure, and FIG. 5 is a cross-sectional view of the structure in FIG. 4 taken along a cutting line CC', referring to FIGS. 4 to 5, the display substrate includes a display area 101 and a bonding area 100, where the bonding area 100 is located at an edge of the display area 101, and the bonding area 100 is connected with the display area 101; the bonding area 100 includes a first non-bendable region 100a, a bendable region 100b, and a second non-bendable region 100c, where the first non-bendable region 100a, the bendable region 100b, and the second non-bendable region 100c are sequentially arranged in a direction away from the display area 101 and are sequentially connected. The display substrate includes a base 1, an inorganic insulating layer 2, a metal conductive layer 3 and an organic insulating layer 4, which are located on the base 1 and successively arranged in a direction away from the base 1. Orthographic projections of the inorganic insulating layer 2 and the organic insulating layer 4 on the base 1 are located in the display area 101, the first non-bendable region 100a and the second non-bendable region 100c, and the metal conductive layer 3 extends from the display area 101 to the first non-bendable region 100a, the bendable region 100b and the second non-bendable region 100c.

Figure 6:
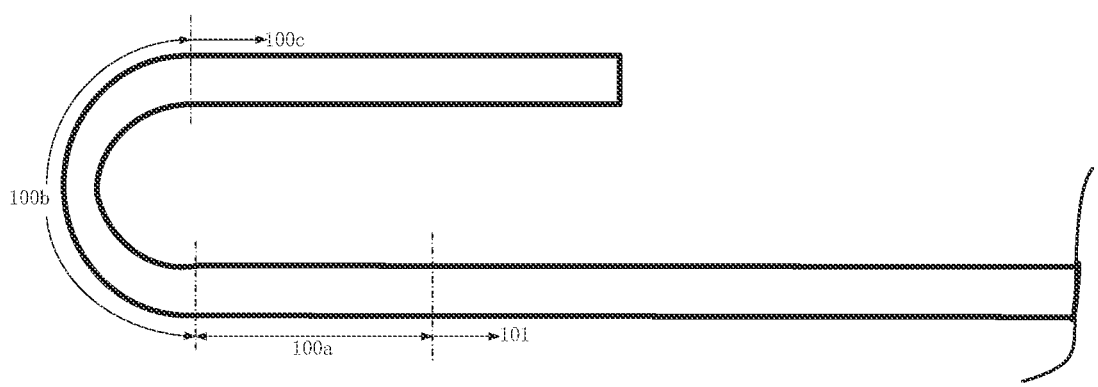
FIG. 6 is a side view of the display substrate shown in FIG. 4 after a bendable region of the display substrate being bent toward a back side of the display substrate.

The metal conductive layer 3 includes a plurality of circuit wires 30 extending from the display area 101 to the second non-bendable region 100c by passing through the first non-bendable region 100a and the bendable region 100b, the circuit wires 30 are circuit wires connected to the pixel driving circuit layer, such as data lines, gate lines, power lines, light-emitting control lines, reset control lines, and the like. A plurality of bonding connection terminals 5 are arranged in the second non-bendable region 100c, the circuit wires 30 are correspondingly connected with the bonding connection terminals 5, respectively, and the bonding connection terminals 5 may be bonded and connected with a device mainboard so that the device mainboard can provide driving or control signals for the circuit wires 30. FIG. 6 is a side view of the display substrate shown in FIG. 4 after the bendable region of the display substrate being bent towards a back side of the display substrate, referring to FIG. 6, the device mainboard is arranged on the back side of the display substrate, and the base 1 is made of a flexible material, and in the subsequent module process of the display substrate, the bendable region 100b of the display substrate is bent towards the back side of the display substrate, so that the second non-bendable region 100c is located on the back side of the display substrate, so as to achieve the bonding connection between the bonding connection terminals 5 and the device mainboard.

In some implementations, the inorganic insulating layer 2, the metal conductive layer 3 and the organic insulating layer 4 are sequentially arranged in a direction away from the base 1, which does not mean that a film (e.g., A) located on a side of any one of films (e.g., B) away from the base 1 is absolutely above the film B, but just represents an order of processes for manufacturing the films.

In the present embodiment, only the metal conductive layer 3 is disposed on the base 1 in the bendable region 100b, and compared with the solution in which the organic planarization layer and the pixel defining layer are arranged on the metal conductive layer 3 in the bendable region 100b in the related art, in the present embodiment, the organic insulating layer 4 with poor bending endurance originally disposed on the metal conductive layer 3 in the bendable region 100b is removed, so that an influence of breakage of the organic insulating layer 4 due to being bent on the metal conductive layer 3 is eliminated, thereby avoiding the breakage of the metal conductive layer 3 caused by the breakage of the organic insulating layer 4, avoiding bending fault of the bendable region 100b, improving the bending yield of the bendable region 100b, and ensuring the quality of the display substrate.

Figure 7:
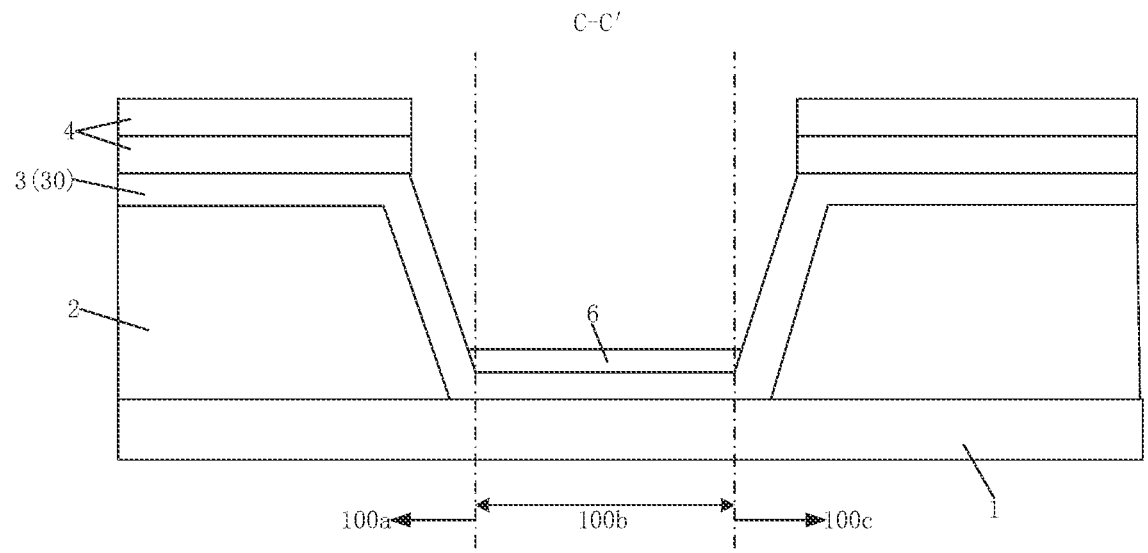
FIG. 7 is a cross-sectional view of the structure in FIG. 4 taken along a cutting line CC'.

FIG. 7 is a cross-sectional view of the structure in FIG. 4 taken along a cutting line CC', as shown in FIG. 7, in some implementations, the display substrate further includes an adjustment protective layer 6 located on a side of the organic insulating layer 4 away from the base 1; an orthographic projection of the adjustment protective layer 6 on the base 1 covers the bendable region 100b. The adjustment protective layer 6 can well protect the metal conductive layer 3 in the bendable region 100b on one hand, and on the other hand, can adjust a position of a neutral layer in all film layers in the bendable region 100b by designing a thickness thereof, so that the metal conductive layer 3 can bear stress during being bent, thereby avoiding breakage of the metal conductive layer 3 during the bendable region 100b being bent.

In some implementations, a material of the adjustment protective layer 6 includes a liquid optical glue. For example, the material of the adjustment protective layer 6 is OCR (optical Clear Resin) glue, the OCR glue is one of optical glues, and is in a liquid state and also called the liquid optical glue or optical water glue. The OCR glue has better water and moisture resistance, and is sprayed on the metal conductive layer 3 by spraying that in the liquid state, so as to form a liquid film of OCR glue, and the liquid film of OCR glue has no fluidity, and the liquid film of OCR glue can become solid film fast without UV (ultraviolet) curing, and the curved OCR glue is colorless and transparent, and has a light transmittance greater than 98%. The adjustment protective layer 6 can well protect the metal conductive layer 3 in the bendable region 100 from water and moisture, and compared with the glue that is coated on the metal conductive layer 3 in the bendable region 100b and needs to be cured through UV in the related art, in the present implementation, the OCR glue has self-curing performance, so that there is no need to reserve a space of a climbing area for the glue, and the problem that the glue to be cured through UV forms a climbing area due to flowing to increase a width of the bezel of the product can be solved, and with the OCR glue, the width of the bezel of the display substrate can be reduced so as to realize a narrow bezel.

In some implementations, a thickness of the adjustment protective layer 6 ranges from 0.2 µm to 20 µm. With the thickness of the protective layer 6 in such range, thickness reduction that can not be realized for the glue to be cured through UV in the related art can be realized, the problem that the thickness of the glue cured through UV in the related art is difficult to be reduced can be solved, and the display substrate can further realize a narrower bezel. Meanwhile, the adjustment protective layer 6 with such thickness is soft and has bending endurance, and is easy to form a relatively small bending radius (less than or equal to 0.1 mm), so that the problem that the glue cured through UV cannot be bent due to the fact that a hardness of the glue is increased with time after the glue is cured through UV in the related art can be solved, and the bezel of the display substrate can be further narrowed due to the small bending radius. Furthermore, the adjustment protective layer 6 with such thickness can also adjust a position of a neutral layer in all film layers in the bendable region 100b, so that the metal conductive layer 3 can bear stress during being bent, thereby avoiding the breakage of the metal conductive layer 3 during the bendable region 100b being bent.

Figure 8:
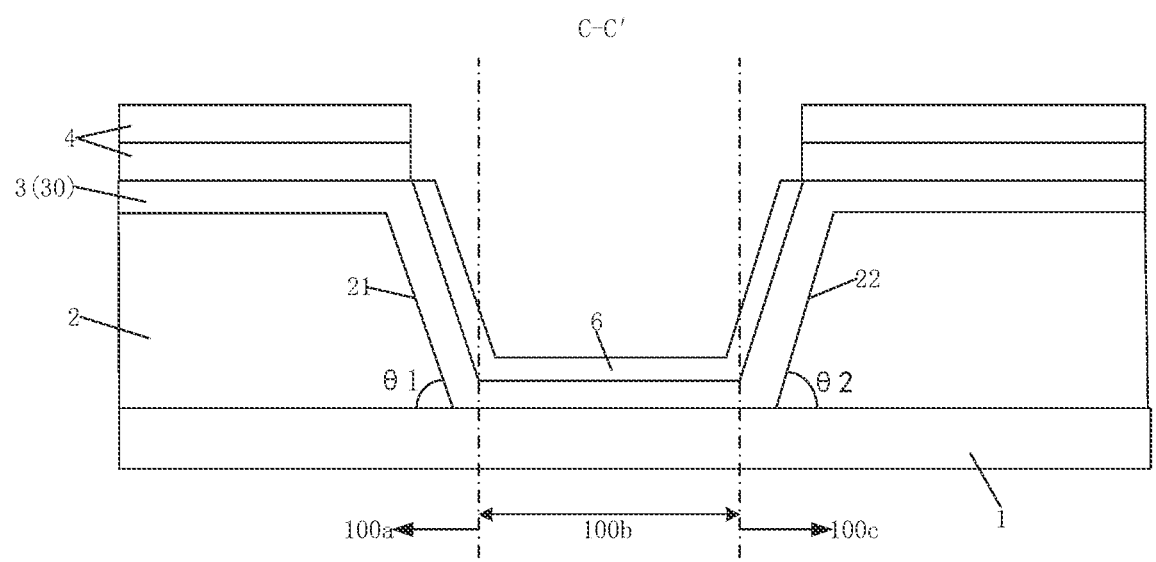
FIG. 8 is a cross-sectional view of the structure in FIG. 4 taken along a cutting line CC'.

FIG. 8 is a cross-sectional view of the structure in FIG. 4 taken along a cutting line CC', in some implementations, referring to FIG. 8, on the basis of the film layer structures in the bonding area 100 in FIG. 7, the inorganic insulating layer 2 includes a first inclined part 21 at a boundary between the first non-bendable region 100a and the bendable region 100b; an included angle θ1 larger than 0° and smaller than or equal to 90° is formed between the first inclined part 21 and the base 1. The inorganic insulating layer 2 includes a second inclined part 22 at a boundary between the second non-bendable region 100c and the bendable region 100b, an included angle θ2 larger than 0° and smaller than or equal to 90° is formed between the second inclined part 22 and the base 1. The orthographic projection of the adjustment protective layer 6 on the base 1 covers orthographic projections of the first inclined part 21 and the second inclined part 22 on the base 1. An orthographic projection of the organic insulating layer 4 on the base 1 does not overlap with the orthographic projections of the first inclined part 21 and the second inclined part 22 on the base 1. That is, in the present embodiment, the adjustment protective layer 6 covers, in addition to the bendable region 100b, the first inclined part 21 and the conductive metal layer 3 arranged on the first inclined part 21, and the second inclined part 22 and the conductive metal layer 3 arranged on the second inclined part 22. With such arrangement, it is ensured that the adjustment protective layer 6 can protect the metal conductive layer 3 on first inclined part 21 and the second inclined part 22, and adjust the stress on the metal conductive layer 3 on the first inclined part 21 and the second inclined part 22, so that the flexibility performance of the metal conductive layer 3 on first inclined part 21 and the second inclined part 22 can be ensured, avoiding the breakage of the metal conductive layer 3 on the first inclined part 21 and the second inclined part 22 during the bending area 100b being bent. In addition, the adjustment protective layer 6 covers the first inclined part 21 and the second inclined part 22, so that external moisture can be prevented from invading the inorganic insulating layer 2, and the metal conductive layer protected by the inorganic insulating layer 2 is prevented from being oxidized and corroded by the external moisture.

Figure 9:
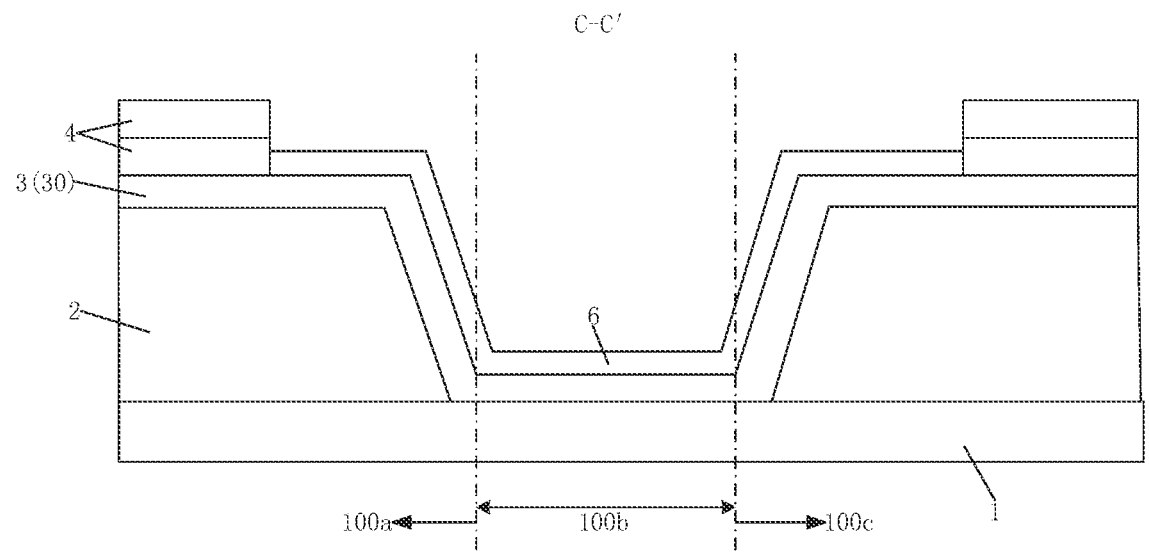
FIG. 9 is a cross-sectional view of the structure in FIG. 4 taken along a cutting line CC'.

FIG. 9 is a cross-sectional view of the structure in FIG. 4 taken along a cutting line CC', in some implementations, referring to FIG. 9, on the basis of the film layer structures in the bonding area 100 in FIG. 8, the adjustment protective layer 6 further extends to cover at least a portion of the first non-bendable region 100a and at least a portion of the second non-bendable region 100c. In each of the first non-bent region 100a and the second non-bendable region 100c, the orthographic projection of the adjustment protective layer 6 on the base 1 does not overlap the orthographic projection of the organic insulating layer 4 on the base 1. In this way, the flexibility of the metal conductive layer 3 in a junction area between the bendable region 100b and the first non-bendable region 100a and a junction area between the bendable region 100b and the second non-bendable region 100c can be further ensured, so that the metal conductive layer 3 in the junction areas is prevented from being broken during the bendable region 100b being bent.

In some implementations, referring to FIG. 9, an overall thickness of the protective layer 6 is uniform.

Figure 10:
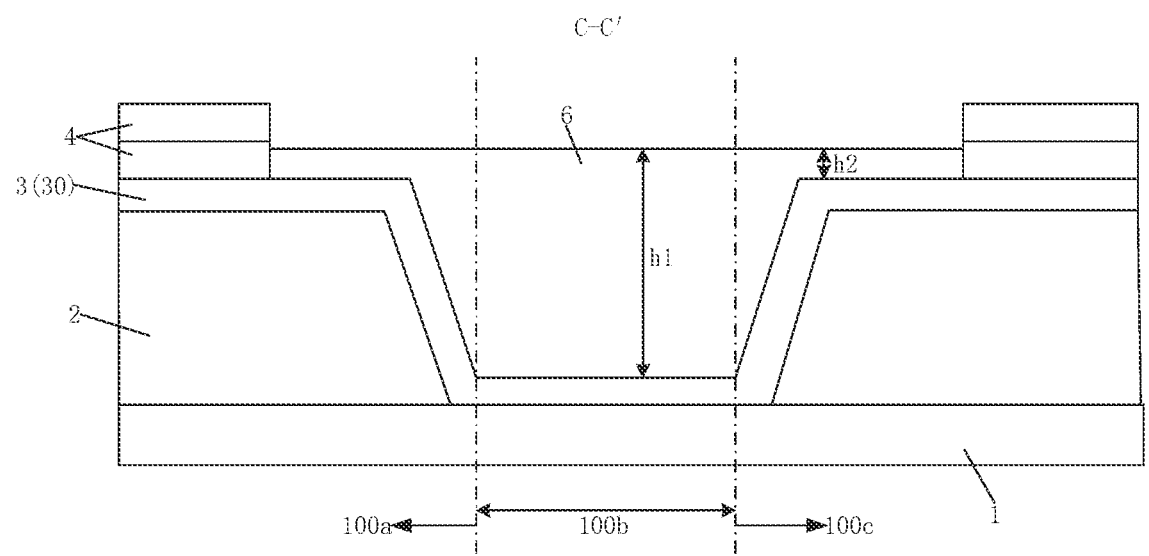
FIG. 10 is a cross-sectional view of the structure in FIG. 4 taken along a cutting line CC'.

FIG. 10 is a cross-sectional view of the structure in FIG. 4 taken along a cutting line CC', in some implementations, referring to FIG. 10, a thickness h1 of a portion of the adjustment protective layer 6 corresponding to the bendable region 100b is greater than a thickness h2 of another portion of the adjustment protective layer 6 corresponding to another region other than the bendable region 100b. In some implementations, a surface of the adjustment protective layer 6 away from the base 1 is parallel to a plane of the base 1. In some implementations, the portion of the adjustment protective layer 6 corresponding to the bendable region 100b fills up a recess formed due to absence of the inorganic insulating layer 2 in the bendable region 100b.

Figure 11:
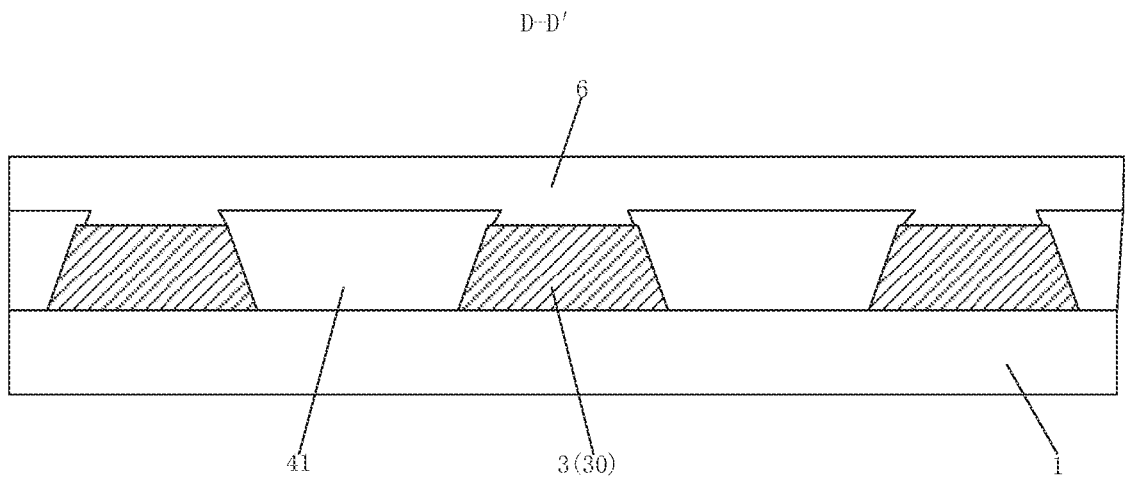
FIG. 11 is a cross-sectional view of the structure in FIG. 4 taken along a cutting line DD'.
Figure 12:
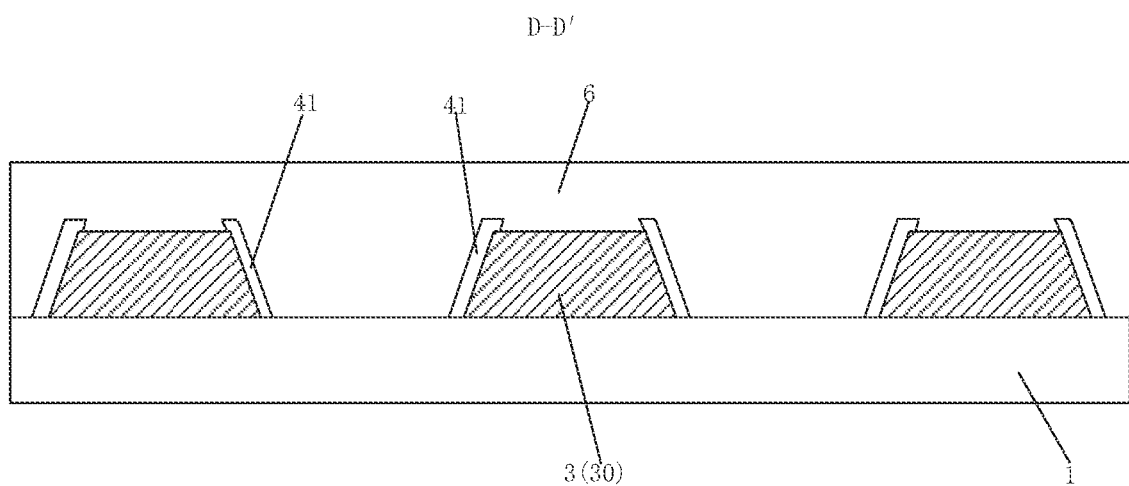
FIG. 12 is a cross-sectional view of the structure in FIG. 4 taken along a cutting line DD'.

FIG. 11 is a cross-sectional view of the structure in FIG. 4 taken along a cutting line DD', and FIG. 12 is a cross-sectional view of the structure in FIG. 4 taken along a cutting line DD', in some implementations, referring to FIGS. 11 and 12, the organic insulating layer 4 includes a first sub-layer 41 and a second sub-layer which are sequentially arranged in a direction away from the base 1. An orthographic projection of the first sub-layer 41 on the base 1 is located in the bendable region 100b. The metal conductive layer 3 includes a plurality of sub-patterns, multiple sub-patterns (i.e., a plurality of circuit wires 30) are arranged in the bendable region 100b. In the bendable region 100b, the orthographic projection of the first sub-layer 41 on the base 1 surrounds at a periphery of an orthographic projection of the sub-pattern on the base 1, and the first sub-layer 41 is in contact with an edge end face of the sub-pattern.

The edge end surface of the sub-pattern refers to a side end surface of each of the plurality of circuit wires 30. The first sub-layer 41 is, for example, the organic planarization layer, and the second sub-layer is, for example, the pixel defining layer. A thickness of the first sub-layer 41 is greater than that of the metal conductive layer 3, so as to fill and level up the surface of the metal conductive layer 3 away from the base 1, thereby facilitating to form the light emitting element in the display area 101 on a flat surface of the first sub-layer 41. The light emitting element includes an anode, a light emitting functional layer, and a cathode sequentially formed on the first sub-laver 41; the plurality of sub-patterns (namely the plurality of circuit wires 30) in the bendable region 100b each are formed by stacked layers of titanium/aluminum/titanium, after the metal conductive layer 3 and the first sub-layer 41 are sequentially prepared in the display area 101, the anode of the light-emitting element is prepared on the first sub-layer 41, the anode is prepared by a patterning process including process steps of film forming, exposure, development, wet etching and the like, and in response to that the anode is formed by wet etching, etching solution may etch the edge end surface of aluminum of the sub-pattern (namely the circuit wire 30) exposed outside in the bendable region 100b, therefore, by disposing the first sub-layer 41 in the bendable region 100b, and making the first sub-laver 41 surround at the periphery of the sub-pattern and contact the edge end surface of the sub-pattern, the first sub-layer 41 can cover and protect the edge end surface of the sub-pattern, and prevent the etching solution from etching the edge end surface of the sub-pattern during forming the anode by wet etching.

In the present embodiment, the inorganic insulating layer 2, the metal conductive layer 3 and the organic insulating layer 4 are sequentially arranged in a direction away from the base 1, which does not mean that the film layer (e.g. A) located on a side of any one of film layers (e.g. B) away from the base 1 is absolutely above the film layer B, but represents the order of the manufacturing processes. The film layer A being on a side of the film layer B away from the base 1 does not mean that all portions of the film layer A are above the film layer B, and it can be understood that in response to that the film layer B includes patterned portions, for example, gaps exist between the sub-patterns (i.e., the circuit wires 30) of the metal conductive layer 3 in the present implementation, the film layer A is prepared later, and a portion of the film layer A may be located between the patterned portions of the film layer B, that is, the film layer B and the film layer A are structurally in a same layer, that is, the film layer A may include a portion located in the same layer as the film layer B; for example, the portion of the organic insulating layer 4 located in the bendable region 100b is located in the gap between the sub-patterns (i.e., the circuit wires 30), and the portion of the organic insulating layer 4 located in the bendable region 100b is in the same layer as the sub-patterns (i.e., the circuit wires 30).

In some implementations, referring to FIG. 11, in the bendable region 100a, orthographic projections of the first sub-layers 41 on the base 1 are complementary to orthographic projections of the sub-patterns on the base 1, and the adjustment protective layer 6 is in contact with surfaces of the first sub-layers 41 and the sub-patterns (i.e., the circuit wires 30) away from the base 1.

In FIG. 11, in the bendable region 100a, the first sub-layer 41 fills space region between the sub-patterns (i.e., the circuit wires 30) and another region other than the sub-patterns (e.g., an edge region other than the sub-patterns), so that the edge end surfaces of the sub-patterns (i.e., the circuit wires 30) are covered by the first sub-layer 41, and thus are prevented from being etched by the etching solution.

In some implementations, referring to FIG. 12, in the bendable region 100b, orthographic projections, which surround the orthographic projections of any two adjacent sub-patterns (i.e., the circuit wires 30) on the base 1, of the first sub-layers 41 on the base 1 are spaced from each other, and the adjustment protective layer 6 is in contact with surfaces of the first sub-layers 41 and the sub-patterns away from the base 1, a portion of the adjustment protective layer 6 is further in contact with the base 1.

In some implementations, a thickness of the first sub-layer 41 in a direction away from the edge end surface of the sub-pattern is in a range from 0.5 μm to 1 μm. That is, the first sub-layer 41 covering the edge end surface of the sub-pattern (i.e., the circuit wire 30) is a thin layer.

In FIG. 12, in the bendable region 100a, the first sub-layer 41 does not completely fill the space region between the sub-patterns (i.e., the circuit wires 30), and the first sub-layer 41 covering the edge end surface of the sub-pattern (i.e., the circuit wire 30) is a thin layer, so that the first sub-layer 41 can also cover the edge end surface of the sub-pattern (i.e., the circuit wire 30) to prevent the sub-pattern from being etched by the etching solution. Meanwhile, the first sub-layer 41 in the bendable region 100a is arranged in this way, so that the flexibility performance of all film layers in the bendable region 100a can be better ensured, a relatively small bending radius of all film layers in the bendable region 100a is ensured, and the bending yield of all film layers in the bendable region 100a is ensured.

In some implementations, the first sub-layer 41 in the bendable region 100a in FIGS. 11 and 12 and the organic planarization layer in the display area 101 are made of a same material and are prepared by a single patterning process (including steps of coating a film layer, exposure, development, and the like).

In the embodiment of the present disclosure, referring to FIG. 6, by performing a bending test on the film layer structures in the bendable region 100b of the display substrate, a test result shows that the maximum strain of the metal conductive layer 3 in the bendable region 100b is 2.39%, which is far less than the elongation at break, which is 10%, of the metal conductive layer 3, and therefore, the film layer structures in the bendable region 100b in the present embodiment has higher bending reliability.

According to the display substrate provided by the embodiment of the present disclosure, the organic insulating layer 4 with poor bending endurance, which is originally arranged on the metal conductive layer 3 in the bendable region 100b in the related art, is removed, so that the influence of bending and breakage of the organic insulating layer 4 on the metal conductive layer 3 is eliminated, the metal conductive layer 3 is prevented from being broken due to the breakage of the organic insulating layer 4, the bending fault of the bendable region 100b is avoided, the bending yield of the bendable region 100b is improved, and the quality of the display substrate is ensured. Meanwhile, the bending radius of the bendable region 100b is reduced, which is beneficial to further narrowing the bezel of the display substrate at a side where the bonding area 100 is located.

In a second aspect, an embodiment of the present disclosure further provides a display module, which includes the display substrate in the foregoing embodiment.

In some implementations, the display module has a display side and a back side, the display side and the back side being opposite to each other; the bendable region of the display substrate is bent towards the back side, the first non-bendable region of the display substrate is located at the display side, and the second non-bendable region of the display substrate is located at the back side.

By adopting the display substrate in the forgoing embodiment, the bending yield of the bendable region of the display module is improved, and the quality of the display module is ensured; meanwhile, the bending radius of the bendable region is reduced, which is beneficial to further narrowing the bezel of the display module at a side where the bonding area is located.

In a third aspect, an embodiment of the present disclosure further provides a display device, including the display module in the foregoing embodiment.

By adopting the display module in the forgoing embodiment, the bending yield of the bendable region of the display device is improved, and the quality of the display device is ensured; meanwhile, the bending radius of the bendable region is reduced, which is beneficial to further narrowing the bezel of the display device at a side where the bonding area is located.

The display device provided by the embodiment of the present disclosure may be any product or component with a display function, such as an OLED panel, an OLED television, an OLED billboard, a display, a mobile phone, a navigator and the like.

It will be understood that the above embodiments are merely exemplary embodiments employed to illustrate the principles of the present disclosure, and the present disclosure is not limited thereto. It will be apparent to those skilled in the art that various improvements and modifications can be made without departing from the spirit and scope of the present disclosure, and these improvements and modifications are to be considered within the scope of the present disclosure.

What is claimed is:

1. A display substrate, comprising a display area and a bonding area, the bonding area being located at a side edge of the display area and being connected with the display area, wherein
the bonding area comprises a first non-bendable region, a bendable region and a second non-bendable region, which are sequentially arranged in a direction away from the display area and are sequentially connected;
the display substrate further comprises a base, an inorganic insulating layer, a metal conductive layer and an organic insulating layer;
the inorganic insulating layer, the metal conductive layer and the organic insulating layer are located on the base and successively arranged in a direction away from the base;
orthographic projections of the inorganic insulating layer and the organic insulating layer on the base are located in the display area, the first non-bendable region and the second non-bendable region;
the metal conductive layer extends from the display area to the first non-bendable region, the bendable region and the second non-bendable region;
the display substrate further comprises an adjustment protective layer located on a side of the organic insulating layer away from the base;
an orthographic projection of the adjustment protective layer on the base covers the bendable region; and
a material of the adjustment protective layer comprises Optical Clear Resin.

2. The display substrate of claim 1, wherein the inorganic insulating layer includes a first inclined part at a boundary between the first non-bendable region and the bendable region;
an included angle larger than 0° and less than or equal to 90° is formed between the first inclined part and the base;
the inorganic insulating layer comprises a second inclined part at a boundary between the second non-bendable region and the bendable region;
an included angle larger than 0° and less than or equal to 90° is formed between the second inclined part and the base; and
the orthographic projection of the adjustment protective layer on the base covers orthographic projections of the first inclined part and the second inclined part on the base.

3. The display substrate of claim 2, wherein the adjustment protective layer further extends to cover at least a portion of the first non-bendable region and at least a portion of the second non-bendable region; and
in the first non-bendable region and the second non-bendable region, the orthographic projection of the adjustment protective layer on the base does not overlap with an orthographic projection of the organic insulating layer on the base.

4. The display substrate of claim 3, wherein an overall thickness of the adjustment protective layer is uniform; or
a thickness of a portion of the adjustment protective layer corresponding to the bendable region is larger than a thickness of another portion of the adjustment protective layer corresponding to another region other than the bendable region.

5. The display substrate of claim 1, wherein the organic insulating layer comprises a first sub-layer and a second sub-layer sequentially arranged in a direction away from the base;
an orthographic projection of the first sub-layer on the base is located in the bendable region;
the metal conductive layer comprises a plurality of sub-patterns;
multiple sub-patterns are arranged in the bendable region;
in the bendable region, an orthographic projection of the first sub-layer on the base surrounds at a periphery of an orthographic projection of the sub-pattern on the base, and the first sub-layer is in contact with an edge end surface of the sub-pattern.

6. The display substrate of claim 5, wherein, in the bendable region, orthographic projection of first sub-layers on the base are complementary to orthographic projections of the sub-patterns on the base; and
the adjustment protective layer is in contact with surfaces of the first sub-layers and the sub-patterns away from the base.

7. The display substrate of claim 5, wherein, in the bendable region, orthographic projections, surrounding at a periphery of orthographic projections of any two adjacent sub-patterns on the base, of first sub-layers on the base are spaced apart from each other;
the adjustment protective layer is in contact with surfaces of the first sub-layers and the sub-patterns away from the base, and a portion of the adjustment protective layer is in contact with the base.

8. The display substrate of claim 7, wherein the first sub-layer has a thickness in a range from 0.5 μm to 1 μm in a direction away from the edge end surface of the sub-pattern.

9. The display substrate of claim 1, wherein a thickness of the adjustment protective layer is in a range from 0.2 μm to 20 μm.

10. The display substrate of claim 1, wherein the base is made of a flexible material.

11. A display module, comprising the display substrate of claim 1.

12. The display module of claim 11, wherein the display module has a display side and a back side opposite to each other,
the bendable region of the display substrate is bent towards the back side;
the first non-bendable region of the display substrate is located at the display side; and
the second non-bendable region of the display substrate is located at the back side.

13. A display device, comprising the display module of claim 11.

14. The display substrate of claim 2, wherein the organic insulating layer comprises a first sub-layer and a second sub-layer sequentially arranged in a direction away from the base;
  an orthographic projection of the first sub-layer on the base is located in the bendable region;
  the metal conductive layer comprises a plurality of sub-patterns;
  multiple sub-patterns are arranged in the bendable region;
  in the bendable region, an orthographic projection of the first sub-layer on the base surrounds at a periphery of an orthographic projection of the sub-pattern on the base, and the first sub-layer is in contact with an edge end surface of the sub-pattern.

15. The display substrate of claim 14, wherein, in the bendable region, orthographic projection of first sub-layers on the base are complementary to orthographic projections of the sub-patterns on the base; and
  the adjustment protective layer is in contact with surfaces of the first sub-layers and the sub-patterns away from the base.

16. The display substrate of claim 14, wherein, in the bendable region, orthographic projections, surrounding at a periphery of orthographic projections of any two adjacent sub-patterns on the base, of first sub-layers on the base are spaced apart from each other;
  the adjustment protective layer is in contact with surfaces of the first sub-layers and the sub-patterns away from the base, and a portion of the adjustment protective layer is in contact with the base.

17. The display substrate of claim 16, wherein the first sub-layer has a thickness in a range from 0.5 μm to 1 μm in a direction away from the edge end surface of the sub-pattern.

18. The display substrate of claim 3, wherein the organic insulating layer comprises a first sub-layer and a second sub-layer sequentially arranged in a direction away from the base;
  an orthographic projection of the first sub-layer on the base is located in the bendable region;
  the metal conductive layer comprises a plurality of sub-patterns;
  multiple sub-patterns are arranged in the bendable region;
  in the bendable region, an orthographic projection of the first sub-layer on the base surrounds at a periphery of an orthographic projection of the sub-pattern on the base, and the first sub-layer is in contact with an edge end surface of the sub-pattern.

19. The display substrate of claim 18, wherein, in the bendable region, orthographic projection of first sub-layers on the base are complementary to orthographic projections of the sub-patterns on the base; and
  the adjustment protective layer is in contact with surfaces of the first sub-layers and the sub-patterns away from the base.

20. The display substrate of claim 18, wherein, in the bendable region, orthographic projections, surrounding at a periphery of orthographic projections of any two adjacent sub-patterns on the base, of first sub-layers on the base are spaced apart from each other;
  the adjustment protective layer is in contact with surfaces of the first sub-layers and the sub-patterns away from the base, and a portion of the adjustment protective layer is in contact with the base.

* * * * *